United States Patent
Illing et al.

(10) Patent No.: US 11,005,472 B2
(45) Date of Patent: May 11, 2021

(54) METHOD FOR OPERATING A TRANSISTOR DEVICE AND ELECTRONIC-CIRCUIT WITH A TRANSISTOR DEVICE

(71) Applicant: Infineon Technologies AG, Neubiberg (DE)

(72) Inventors: Robert Illing, Finkenstein (AT); Christian Djelassi-Tscheck, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 144 days.

(21) Appl. No.: 16/287,412

(22) Filed: Feb. 27, 2019

(65) Prior Publication Data

US 2019/0267983 A1 Aug. 29, 2019

(30) Foreign Application Priority Data

Feb. 28, 2018 (DE) ...................... 10 2018 104 621.9

(51) Int. Cl.
| | |
|---|---|
| *H03K 17/082* | (2006.01) |
| *H03K 17/08* | (2006.01) |
| *H02M 1/00* | (2006.01) |
| *H03K 17/042* | (2006.01) |

(52) U.S. Cl.
CPC . *H03K 17/0822* (2013.01); *H02M 2001/0029* (2013.01); *H03K 17/04206* (2013.01); *H03K 2017/0806* (2013.01)

(58) Field of Classification Search
CPC ...... H02M 2001/0029; H03K 17/0822; H03K 17/04206

USPC ............................. 323/289; 361/57, 87, 93.9
See application file for complete search history.

(56) References Cited

U.S. PATENT DOCUMENTS

| | | | | |
|---|---|---|---|---|
| 6,700,428 | B2* | 3/2004 | Sander | H03K 17/0822 327/312 |
| 8,674,727 | B2* | 3/2014 | Mauder | H03K 17/687 327/108 |
| 8,953,294 | B2* | 2/2015 | Graf | H03K 17/0822 361/93.1 |
| 2005/0088216 | A1* | 4/2005 | Arndt | H01L 23/62 327/325 |

(Continued)

FOREIGN PATENT DOCUMENTS

| | | |
|---|---|---|
| DE | 102012216318 A1 | 4/2013 |
| DE | 102014226164 A1 | 6/2016 |

*Primary Examiner* — Gary A Nash
(74) *Attorney, Agent, or Firm* — Slater Matsil, LLP

(57) ABSTRACT

In accordance with an embodiment, a method includes operating a transistor device by a drive circuit in one of a first operating mode and a second operating mode based on an operating mode signal received by the drive circuit. Operating the transistor device in each of the first operating mode and the second operating mode includes switching on the transistor device based on a drive signal received by the drive circuit; monitoring at least one operating parameter of the transistor device; and switching off the transistor device independent of the drive signal when the at least one operating parameter reaches a respective predefined off-threshold. Switching on the transistor device in the second operating mode includes switching on the transistor with a second slew rate that is smaller than a first slew rate in the first operating mode.

18 Claims, 10 Drawing Sheets

(56) References Cited

U.S. PATENT DOCUMENTS

| | | | |
|---|---|---|---|
| 2007/0040542 A1* | 2/2007 | Cortigiani | H03K 17/0822 323/312 |
| 2009/0027096 A1* | 1/2009 | Mourrier | H03K 17/166 327/170 |
| 2011/0148476 A1* | 6/2011 | Fanic | H03K 17/0822 327/109 |
| 2012/0319740 A1* | 12/2012 | Thiele | H03K 17/14 327/109 |
| 2013/0069612 A1* | 3/2013 | Feldtkeller | G05F 1/567 323/284 |
| 2013/0083442 A1 | 4/2013 | Hiyama | |
| 2015/0280416 A1* | 10/2015 | Kreuter | H03K 17/0826 361/55 |
| 2016/0294384 A1* | 10/2016 | Schindler | H03K 5/08 |
| 2017/0033783 A1* | 2/2017 | Rahman | H03K 17/0822 |
| 2017/0054437 A1* | 2/2017 | Donath | H03K 17/04106 |

* cited by examiner

METHOD FOR OPERATING A TRANSISTOR DEVICE AND ELECTRONIC-CIRCUIT WITH A TRANSISTOR DEVICE

This application claims the benefit of German Application No. 102018104621.9, filed on Feb. 28, 2018, which application is hereby incorporated herein by reference in its entirety.

TECHNICAL FIELD

This disclosure in general relates to a method for operating a transistor device and an electronic circuit including a transistor device.

BACKGROUND

Transistor devices such as MOSFETs (Metal Oxide Semiconductor Field-Effect Transistors) are widely used as electronic switches for switching loads in various types of applications such as, for example, power conversion, automotive, motor drive, household or consumer electronic applications. Driving such a transistor device may include switching on or off the transistor device based on a drive signal. Further, driving such a transistor device may include, in an on-state of the transistor device, monitoring one or more operating parameters in order to detect an overload scenario, and switching off the transistor device independent of the drive signal when an overload scenario is detected.

In particular, an overload scenario may occur when a load driven by the transistor device is a capacitive load. A capacitive load, in a discharged state, may draw a high inrush current. This inrush current may trigger a switching off of the transistor device although it can be expected that the inrush current will decrease as the capacitive load is charged.

There is therefore a need for an improved method of operating a transistor device and an electronic circuit with a transistor device and a drive circuit.

SUMMARY

One example relates to a method. The method includes operating a transistor device by a drive circuit in one of a first operating mode and a second operating mode based on an operating mode signal received by the drive circuit. Operating the transistor device in each of the first operating mode and the second operating mode includes switching on the transistor device based on a drive signal received by the drive circuit, monitoring at least one operating parameter of the transistor device, switching off the transistor device independent of the drive signal when the at least one operating parameter reaches a respective predefined off-threshold. Switching on the transistor device in the second operating mode comprises switching on the transistor with a second slew rate that is smaller than a first slew rate in the first operating mode. Further, the predefined off-threshold is lower in the second operating mode than in the first operating mode.

Another example of a method includes operating a transistor device by a drive circuit in one of a first operating mode and a second operating mode based on an operating mode signal received by the drive circuit. Operating the transistor device in each of the first operating mode and the second operating mode includes switching on the transistor device based on a drive signal received by the drive circuit, limiting a load current through the transistor device to a maximum current level, wherein the maximum current level is lower in the second operating mode than in the first operating mode.

A further example relates to an electronic circuit including a drive circuit. The drive circuit is configured to operate a transistor device in one of a first operating mode and a second operating mode based on an operating mode signal received by the drive circuit. The drive circuit is configured, in each of the first operating mode and the second operating mode, to switch on the transistor device based on a drive signal received by the drive circuit, to monitor at least one operating parameter of the transistor device, and to switch off the transistor device independent of the drive signal when the at least one operating parameter reaches a respective predefined off-threshold. The drive circuit is further configured, in the second operating mode, to switch on the transistor device with a second slew rate that is smaller than a first slew rate in the first operating mode. Further, the predefined off-threshold is lower in the second operating mode than in the first operating mode.

An electronic circuit according to another example includes a drive circuit. The drive circuit is configured to operate a transistor device in one of a first operating mode and a second operating mode based on an operating mode signal received by the drive circuit. The drive circuit is configured, in each of the first operating mode and the second operating mode, to switch on the transistor device based on a drive signal received by the drive circuit, and to limit a load current through the transistor device to a maximum current level, wherein the maximum current level is lower in the second operating mode than in the first operating mode.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION OF ILLUSTRATIVE EMBODIMENTS

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
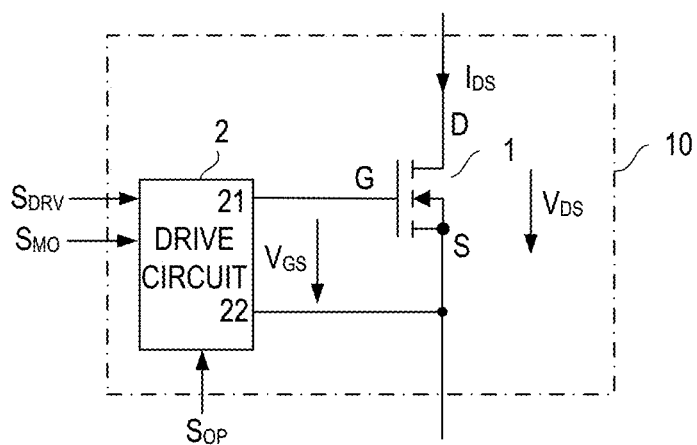
FIG. 1 illustrates an electronic circuit with a transistor device and a drive circuit configured to drive the transistor device.

FIG. 1 shows one example of an electronic circuit that includes a transistor device 1 and a drive circuit 2. The drive circuit 2 is configured to drive the transistor device 1 based on a drive signal $S_{DRV}$, an operating mode signal $S_{MO}$. In FIG. 1, signal $S_{OP}$ received by the drive circuit 2 represents the operating parameter OP. This signal $S_{OP}$ is also referred to as operating parameter signal in the following. The transistor device 1 includes a drive input between a control node G and a first load node S and a load path between a second load node D and the first load node S. The transistor device 1 switches on or off dependent on a drive voltage $V_{GS}$, received at the drive input G, S.

The drive circuit 2 generates the drive voltage $V_{GS}$ at an output 21, 21 connected to the drive input G, S of the transistor device 1. More specifically, the output of the drive circuit 2 includes a first output node 21 coupled to the control node G and a second output node 22 coupled to the first load node S. The drive signal $S_{DRV}$ received by the drive circuit 2 may be any type of signal suitable for conveying a switching information, wherein the switching information defines whether it is desired to switch on or switch off the transistor device 1. According to one example, the drive signal $S_{DRV}$ has one of two different signal levels, an on-level indicating that the transistor device 1 is to be switched on, or an off-level indicating that the transistor device 1 is to be switched off.

Further, the drive circuit 2 operates the transistor in a first operating mode or a second operating mode dependent on the operating mode signal $S_{MO}$ received by the drive circuit 2. Details of these operating modes are explained herein further below. The operating mode signal $S_{MO}$ may be any type of signal suitable for conveying an operating mode information, wherein the operating mode information defines whether it is desired to operate the transistor device 1 in the first operating mode or the second operating mode. According to one example, the operating mode signal $S_{MO}$ has one of two different signal levels, a first level indicating that the transistor device 1 is to be operated in the first operating mode, or a second level indicating that the transistor device 1 is to be operated in the second operating mode.

The transistor device 1 and the drive circuit 2 may be implemented as one integrated circuit in an integrated circuit package 10 (schematically illustrated in dashed lines in FIG. 1). The integrated circuit may include one semiconductor body (die) in which both the transistor device 1 and the drive circuit 2 are integrated, or two semiconductor bodies, a first one in which the transistor device 1 is integrated and a second one in which the drive circuit 2 is integrated. These two semiconductor bodies may be arranged in a chip-on-chip or a chip-by-chip configuration inside the package 10. According to another example, the drive circuit 2 is integrated in one integrated circuit package and the transistor device is integrated in another integrated circuit package.

According to one example, the transistor device 1 is a MOSFET (Metal Oxide Semiconductor Field-Effect Transistor). It should be noted that the term MOSFET as used herein denotes any type of field-effect transistor with an insulated gate electrode (often referred to as IGFET) independent of whether the gate electrode includes a metal or another type of electrically conducting material, and independent of whether the gate dielectric includes an oxide or another type of dielectrically insulating material. The circuit symbol of the transistor device 1 shown in FIG. 1 represents an n-type enhancement MOSFET. However, this is just for illustration purposes. Any other type of MOSFET such as a p-type enhancement or depletion MOSFET or an n-type depletion MOSFET, or any other type of field-effect transistor such as an IGBT (Insulated Gate Bipolar Transistor) or a JFET (Junction Field-Effect Transistor) may be used as well.

In a MOSFET, the control node G is also referred to as gate node, the first load node S is also referred to as source node, the second load node D is also referred to as drain node, and the drive voltage $V_{GS}$ is also referred to as gate-source voltage. Although the transistor device 1 shown in FIG. 1 is not restricted to be implemented as a MOSFET, the terms gate node G, source node S and drain node D will be used in the following to denote the control node, the first load node and the second load node, respectively.

Figure 2A:
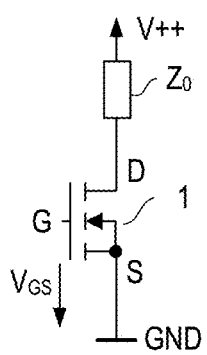
FIGS. 2A to 2C show different examples of how the electronic circuit with the transistor device may be used as an electronic switch.
Figure 2B:
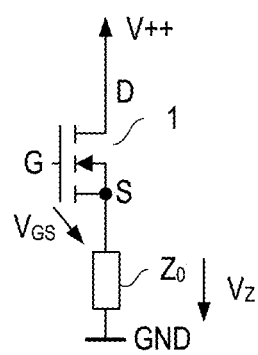
Figure 2C:
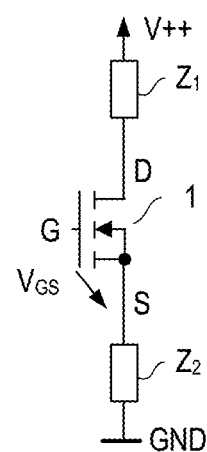

The electronic circuit with the transistor device 1 and the drive circuit 2 may be used as an electronic switch in various types of electronic circuits. Some examples of how the electronic circuit may be used as an electronic switch are illustrated in FIGS. 2A to 2C. For the ease of illustration only the transistor device 1 is shown and the drive circuit 2 is omitted in these figures. Referring to FIG. 2A, the electronic circuit may be used as a low-side switch. In this case, the load path D-S of the transistor device 1 is connected between a load $Z_0$ and a circuit node where a negative supply potential or ground potential GND is available, wherein a series circuit with the load path D-S of the transistor device 1 and the load $Z_0$ is connected between a circuit node for a positive supply potential V++ and the circuit node for the negative supply potential or ground GND. Referring to FIG. 2B, the electronic circuit may be used as a high-side switch. In this example, the load path D-S of the transistor device 1 is connected between the circuit node for the positive supply potential V++ and the load $Z_o$. According to another example shown in FIG. 2C, the load path D-S is connected between two loads $Z_1$, $Z_2$, wherein a series circuit that includes the loads $Z_1$, $Z_2$ and the load path D-S is connected between circuit nodes for the positive supply potential V++ and the negative supply potential or ground GND.

Figure 3:
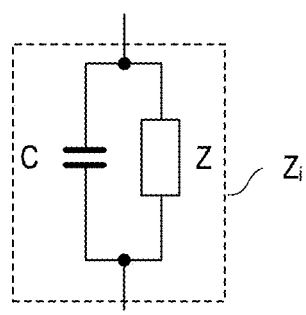
FIG. 3 shows one example of a capacitive load.

According to one example, at least one of the loads $Z_0$, $Z_1$, $Z_2$ shown in FIGS. 2A to 2C is a capacitive load. One example of a capacitive load $Z_i$ is illustrated in FIG. 3. This load $Z_i$ includes a capacitive component C and a further load component Z connected in parallel with the capacitive component C. The further load component may include a circuit with a plurality of electronic components. According to one example, the further load component is an LED (Light Emitting Diode) module that includes one or more LEDs and the capacitive component is an input capacitor of the LED module that serves to stabilize an input voltage received by the LED module.

Figure 4:
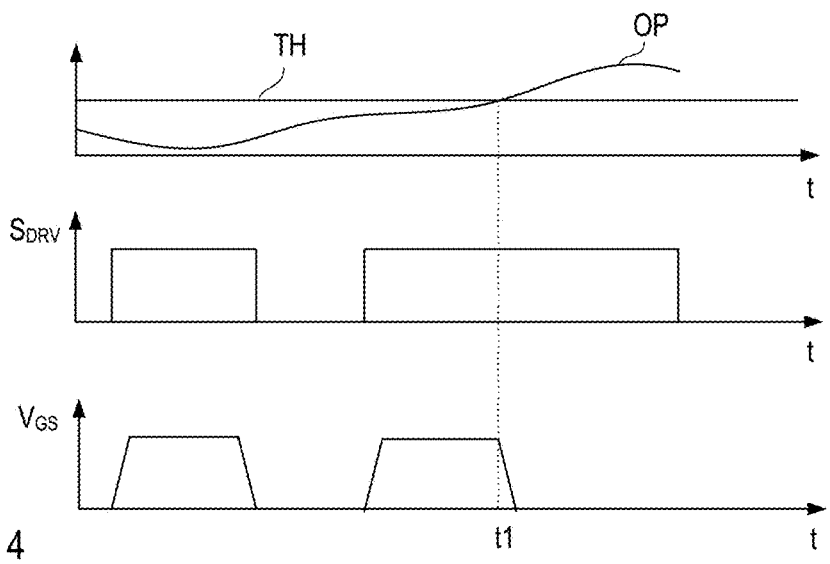
FIG. 4 shows signal diagrams that illustrate operating the transistor device based on a drive signal and an operating parameter.

FIG. 4 shows examples of signal diagrams of the operating parameter OP, the drive signal $S_{DRV}$ and the gate-source voltage $V_{GS}$ that illustrate operating the transistor device 1 based on the drive signal $S_{DRV}$ and the operating parameter OP. Basically, the drive voltage $V_{GS}$ is generated such that the drive voltage $V_{GS}$ changes from a signal level that switches off the transistor device 1 to a signal level that switches on the transistor device whenever a signal level of the drive signal $S_{DRV}$ changes from the off-level to the on-level, and such that drive voltage $V_{GS}$ changes from the signal level that switches on the transistor device 1 to the signal level that switches off the transistor device whenever a signal level of the drive signal $S_{DRV}$ changes from the on-level to the off-level. Just for the purpose of illustration, in FIG. 4, the on-level of the drive signal $S_{DRV}$ is a high signal level, while the off-level is a low signal level. It should be noted that the drive signal $S_{DRV}$ and the drive voltage $V_{GS}$ are only schematically illustrated in FIG. 4A so that, for example, inevitable delay times (propagation delays) between falling and rising edges of the drive signal $S_{DRV}$ and corresponding edges of the drive voltage $V_{GS}$ are not illustrated.

When the signal level of the drive signal $S_{DRV}$ changes the voltage level of the drive voltage $V_{GS}$ does not immediately change, but the drive voltage $V_{GS}$ gradually increases over the time (when the transistor device switches on) or gradually decreases over the time (when the transistor device switches off). The drive voltage is drawn to linearly increase and linearly decrease in the example shown in FIG. 4. This, however, is only for the purpose of illustration. A more realistic signal waveform of the drive voltage $V_{GS}$, when switching on the transistor device 1, is shown in FIG. 5.

Figure 5:
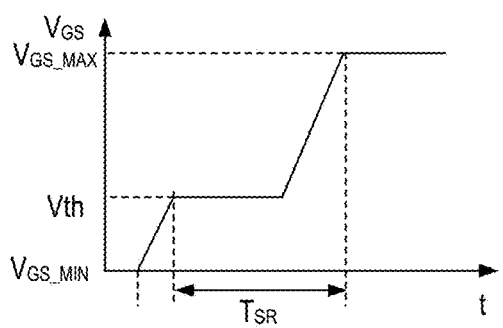
FIG. 5 shows a timing diagram of a drive voltage that illustrates switching on the transistor device in greater detail.

Referring to FIG. 5, the drive voltage, in a first phase, increases until it reaches a threshold voltage Vth of the transistor device 1. The transistor device 1 is in an off-state before the drive voltage $V_{GS}$ reaches the threshold voltage Vth, that is, the transistor device blocks and, therefore, does not conduct a current. The transistor device starts to conduct when the drive voltage $V_{GS}$ reaches the threshold voltage Vth. Further, a voltage level of the drive voltage $V_{GS}$ essentially remains on the threshold voltage Vth for a while, which is known as Miller plateau, before the drive voltage $V_{GS}$ further increases. After the drive voltage $V_{GS}$ has reached the threshold voltage $V_{GS}$, an on-resistance (which is often referred to as RDS_on) is dependent on the voltage level of the drive voltage $V_{GS}$ and decreases as the voltage level of the drive voltage $V_{GS}$ increases. The "on-resistance" of the transistor device is the electrical resistance of the transistor device between the first and second load node (source and drain node) S, D. That is, the on-resistance is relatively high when the drive voltage $V_{GS}$ equals the threshold voltage Vth and then decreases as the drive voltage further increases.

A measure of how fast the drive voltage $V_{GS}$ increases (decreases) when the transistor device switches on (switches off) can be referred to as slew rate SR of the drive voltage $V_{GS}$. The slew rate of the drive voltage $V_{GS}$ affects a slew rate $SR_{VZ}$ of a voltage $V_Z$ (see, for example FIGS. 2A-2C) across the load Z. The slew rate $SR_{VZ}$ of the load voltage $V_Z$ can be defined as a ratio between a voltage difference $0.7 \cdot V_{Z\_MAX} - 0.3 \cdot V_{Z\_MAX}$ between 70% of a maximum level $V_{Z\_MAX}$ of the load voltage $V_Z$ and 30% of a maximum level $V_{Z\_MAX}$ of the load voltage $V_Z$ and a time duration $T_{VZ}$ it takes the load voltage $V_Z$ to increase from the lower one $(0.3 \cdot V_{Z\_MAX})$ of these levels to the higher one $(0.7 \cdot V_{Z\_MAX})$ of these levels ($SR_{VZ} = (0.7 \cdot V_{Z\_MAX} - 0.3 \cdot V_{Z\_MAX})/T_{VZ}$). The slew rate SR of the drive voltage $V_{GS}$ is, for example, given by a ratio between a voltage difference $V_{GS\_MAX} - Vth$ between a maximum level $V_{GS\_MAX}$ of the drive voltage $V_{GS}$ and the threshold voltage Vth and a time $T_{SR}$ it takes the drive voltage $V_{GS}$ to increase from the threshold voltage Vth to the maximum level $V_{GS\_MAX}$, that is, $SR = (V_{GS\_MAX} - Vth)/T_{SR}$. The slew rate of the drive voltage $V_{GS}$ can be adjusted, this is explained in further detail below. In the following, "slew rate" means the slew rate of the drive voltage $V_{GS}$ when switching on the transistor device 1.

Referring to FIG. 4, the transistor device 1 is not only driven based on the drive signal $S_{DRV}$ bus is further driven based on the operating parameter OP. Driving the transistor device based on the operating parameter OP includes comparing the operating parameter OP with a threshold TH and switching off the transistor device independent of the drive signal when the operating parameter reaches the threshold TH. This is illustrated at time instance ti in FIG. 4. At this time instance ti, the drive signal $S_{DRV}$ has an on-level, but the operation parameter OP reaches the threshold TH so that the drive circuit 2 overrides the drive signal $S_{DRV}$ and switches off the transistor device 1. It should be noted that "comparing the operating parameter OP with the threshold TH" may include comparing more than one operating parameter with a respective threshold. In this case, the transistor device 1 is switched off whenever one of these comparisons reveals that one operating parameter has reached the respective threshold. Detecting that the operating parameter OP has reached the threshold TH is referred to as detecting a fault in the following.

Assume that in the applications shown in FIGS. 2A and 2B the load $Z_0$ is a capacitive load or that in the application shown in FIG. 2C one of the loads $Z_1$, $Z_2$ is a capacitive load.

Further, assume that the capacitive component C is discharged and the transistor device 1 switches on. In this case, a high inrush current may flow through the transistor device 1. Such inrush current may cause that a fault be detected and that the transistor device 1 is switched off. Conventionally, the threshold TH is selected such that a fault is detected only in extraordinary operating scenarios that may lead to the transistor device to the border of its safe operating area (SOA), or beyond. Operating the transistor device 1 at the border of its safe operating area may already cause a degradation of the transistor device 1. For this reason, in some applications, the fault detections are counted and the transistor device 1 is prevented from switching on after a predefined number of fault detections has been reached. Charging the capacitive component of a capacitive load, however, is not considered an extraordinary operating scenario. Thus, a high inrush current resulting from charging of a capacitive component should not cause a degradation of the transistor device 1.

Figure 6:
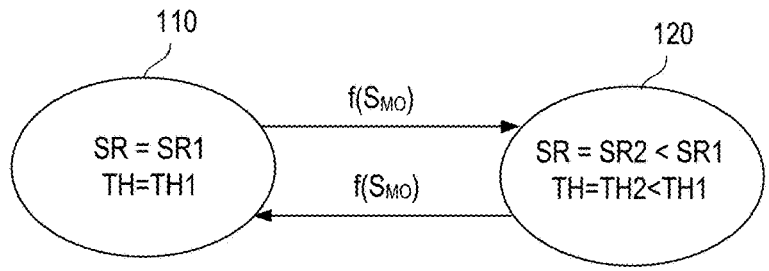
FIG. 6 shows a state diagram that illustrates one example of a method for operating the transistor device in a first operating or a second operating mode based on an operating mode signal.

According to one example, operating the transistor device therefore includes operating the transistor device in one of a first operating mode and a second operating mode dependent on the operating mode signal $S_{MO}$. This is illustrated in FIG. 6, which shows a state diagram of one example of operating the transistor device 1. Referring to FIG. 6, the method changes between a first operating mode no and a second operating mode 120 dependent on the operating mode signal $S_{MO}$. (In FIG. 6, $f(S_{MO})$ simply denotes that a transition between the two operating modes 110, 120 is a function of the operating mode signal.) According to one example, operating the transistor device 1 changes from the first operating mode no to the second operating mode 120 when the operating mode signal $S_{MO}$ changes from a first level to a second level and changes from the second operating mode 120 to the first operating mode no when the operating mode signal $S_{MO}$ changes from the second level to the first level.

Operating the transistor device 1 in each of the first operating mode no and the second operating mode 120 is in accordance with the FIG. 4 and the corresponding explanation. However, the slew rate SR and the threshold TH for the fault detection are different in these two operating modes. In the first operating mode no, the transistor device 1 is operated with a first slew rate SR1 and the threshold TH has a first level TH1. In the second operating mode 120, the transistor device 1 is operated with a second slew rate SR2 smaller than the first slew rate SR1 (SR2<SR1) and the threshold TH has a second level TH2 smaller than the first level TH1 (TH2<TH1). According to one example, the second level TH2 is between 50% and 80% of the first level, that is 0.5·TH1<TH2<0.8·TH1.

The operating parameter OP is a parameter that is suitable to detect a load condition of the transistor device 1 and that is suitable to detect when there is the risk that the transistor device 1 is overloaded and might be damaged or destroyed when further operated under this load condition. Some examples of operating parameters suitable to detect a load condition of the transistor device 1 are explained in the following.

Figure 7:
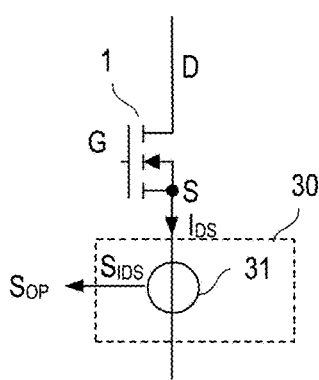
FIG. 7 illustrates a current sensor configured to measure a load current, which represents one example of an operating parameter.

Referring to FIG. 7, a load current $I_{DS}$ through the transistor device 1 may be used as the operating parameter OP. This load current $I_{DS}$ may be measured using any kind of current sensor 31 that is suitable to measure the load current $I_{DS}$ and output a current measurement signal $S_{IDS}$ that represents the load current $I_{DS}$. According to one example, the current measurement signal $S_{IDS}$ is proportional to the load current $I_{DS}$. This current measurement signal is used as the operating parameter signal $S_{OP}$ in this example.

Figure 8:
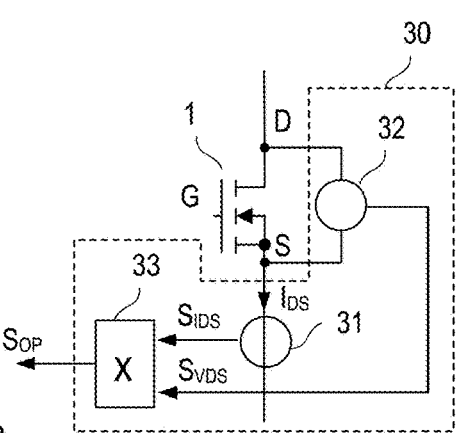
FIG. 8 illustrates a power sensor configured to measure a power dissipated by the transistor device, which represents one example of an operating parameter.

According to another example shown in FIG. 8, the operating parameter is a power dissipated in the transistor device 1. This power is given by a load path voltage $V_{DS}$, which is the voltage across the load path D-S, multiplied with the load current $I_{DS}$. According to one example, a power detector configured to detect the dissipated power includes a current sensor 31 of the type explained with reference to FIG. 7 that outputs a current measurement signal $S_{IDS}$ representing the load current $I_{DS}$. Further, the power detector includes a voltage sensor 32 configured to detect the load path voltage $V_{DS}$ and output a signal $S_{VDS}$ representing the load path voltage $V_{DS}$. The voltage sensor 32 may be implemented using any kind of voltage sensor suitable to detect the load path voltage and output a corresponding voltage measurement signal $S_{VDS}$. Referring to FIG. 8, a multiplier 33 receives the current measurement signal $S_{IDS}$ and the voltage measurement signal $S_{VDS}$ and multiplies these signals in order to obtain a signal representing the dissipated power. This signal is output as the operating parameter signal $S_{OP}$ by the multiplier 33.

Figure 9:
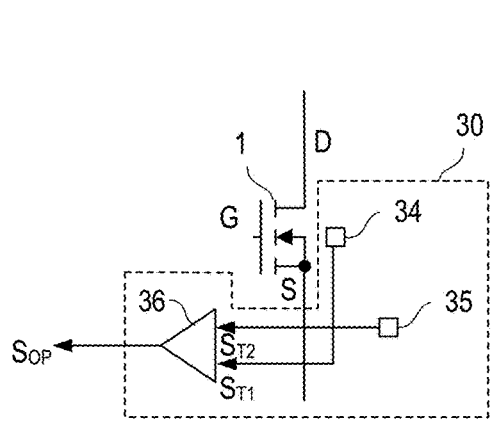
FIG. 9 illustrates a temperature difference sensor configured to measure a temperature difference, which represents another example of an operating parameter.

According to another example shown in FIG. 9, the operating parameter OP is a temperature difference between a first temperature T1 measured at a first position of the transistor device 1 and a second temperature T2 measured at a second position, wherein the second position is spaced apart from the first position. Referring to FIG. 9, the first temperature T1 at the first position may be measured using a first temperature sensor 34 and the second temperature T2 at the second position may be measured using a second temperature sensor 35. The first temperature sensor 34 outputs a first temperature signal $S_{T1}$ that represents the first temperature, and the second temperature sensor 35 outputs a second temperature signal $S_{T2}$ that represents the second temperature. A calculation unit 36 calculates the difference between the first and second temperature signal $ST_1$, $ST_2$ and operates the operating parameter signal $S_{OP}$ representing the temperature difference.

Figure 10:
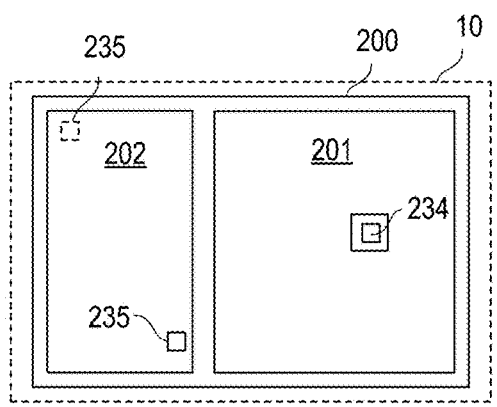
FIG. 10 shows a top view of a semiconductor arrangement and illustrates positions where temperatures may be measured by the temperature difference sensor.

FIG. 10 schematically illustrates one example where the first and second positions of the first and second temperature sensors 34, 35 may be located. FIG. 10 illustrates a top view of a semiconductor body 200 in which both the transistor device 1 and the drive circuit 2 are integrated. In this example, the transistor device 1 is integrated in a first region 201 of the semiconductor body 200 and the drive circuit 2 is integrated in a second region 202 of the semiconductor body 200. In the example shown in FIG. 10, the first temperature T1 is measured at a first position 234 that is inside the first region 201. A second position 235 where the second temperature T2 is measured is spaced apart from the first region 201, that is, spaced apart from the transistor device 1. Two different examples of where the second position 235 may be located are illustrated in FIG. 1. One possible location of the second position is illustrated in solid lines in FIG. 10 and another possible location is illustrated in dashed lines in FIG. 10. It goes without saying that there are various other possible locations for the second position 235.

Referring to the above, the transistor device 1 and the drive circuit 2 may be integrated in two different semiconductor bodies inside the same package 10. In this case, the first position may be a position on one of the semiconductor bodies and the second position may be a position on the other one of the semiconductor bodies.

According to yet another example, the operating parameter is the temperature measured at one position of the transistor device 1. This position can be one of the first and second positions 234, 235 explained with reference to FIG. 10, or a position different from these positions 234, 235.

Figure 11A:
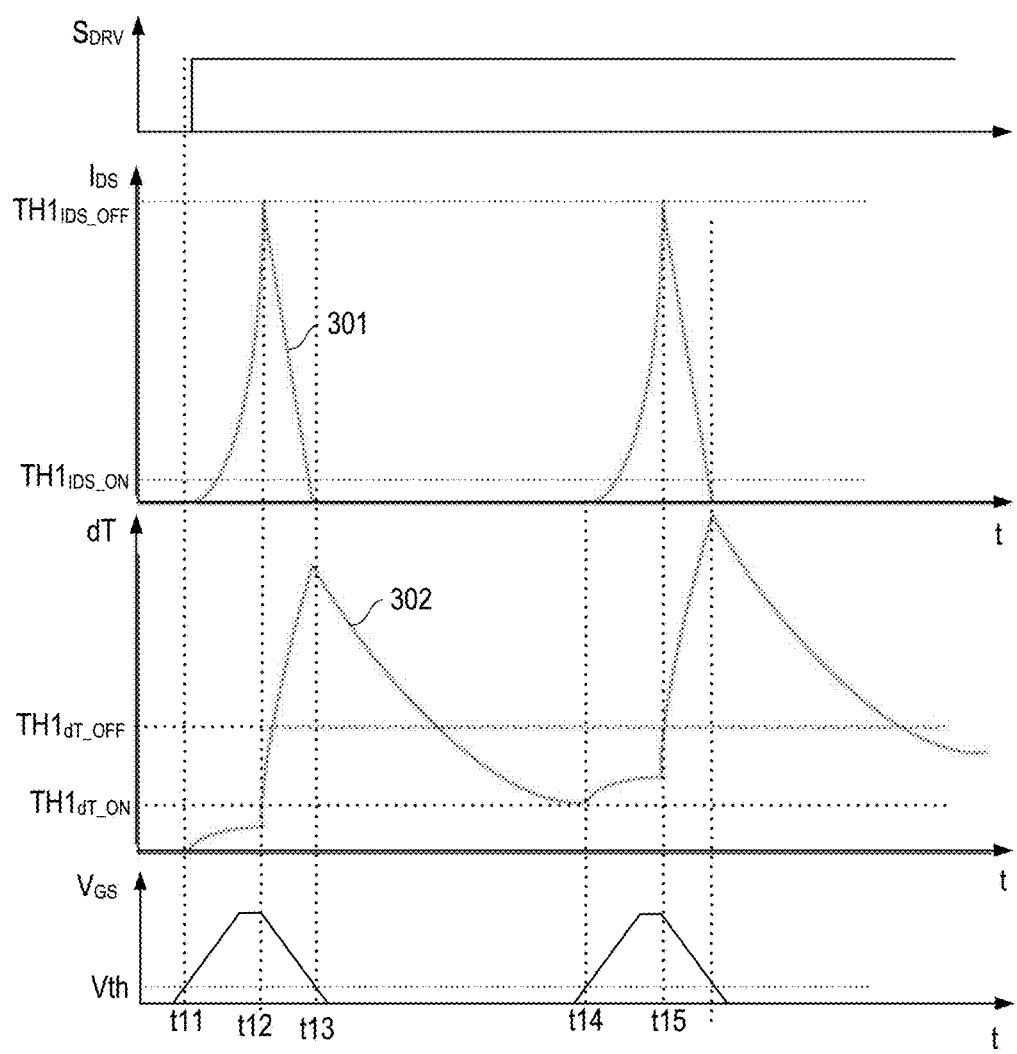
FIGS. 11A and 11B show timing diagrams that illustrate operating the transistor device in the first operating mode (FIG. 11A) and the second operating mode (FIG. 11B) under the same load conditions in order to illustrate an improvement that can be obtained by operating the transistor device in the second operating mode.
Figure 11B:
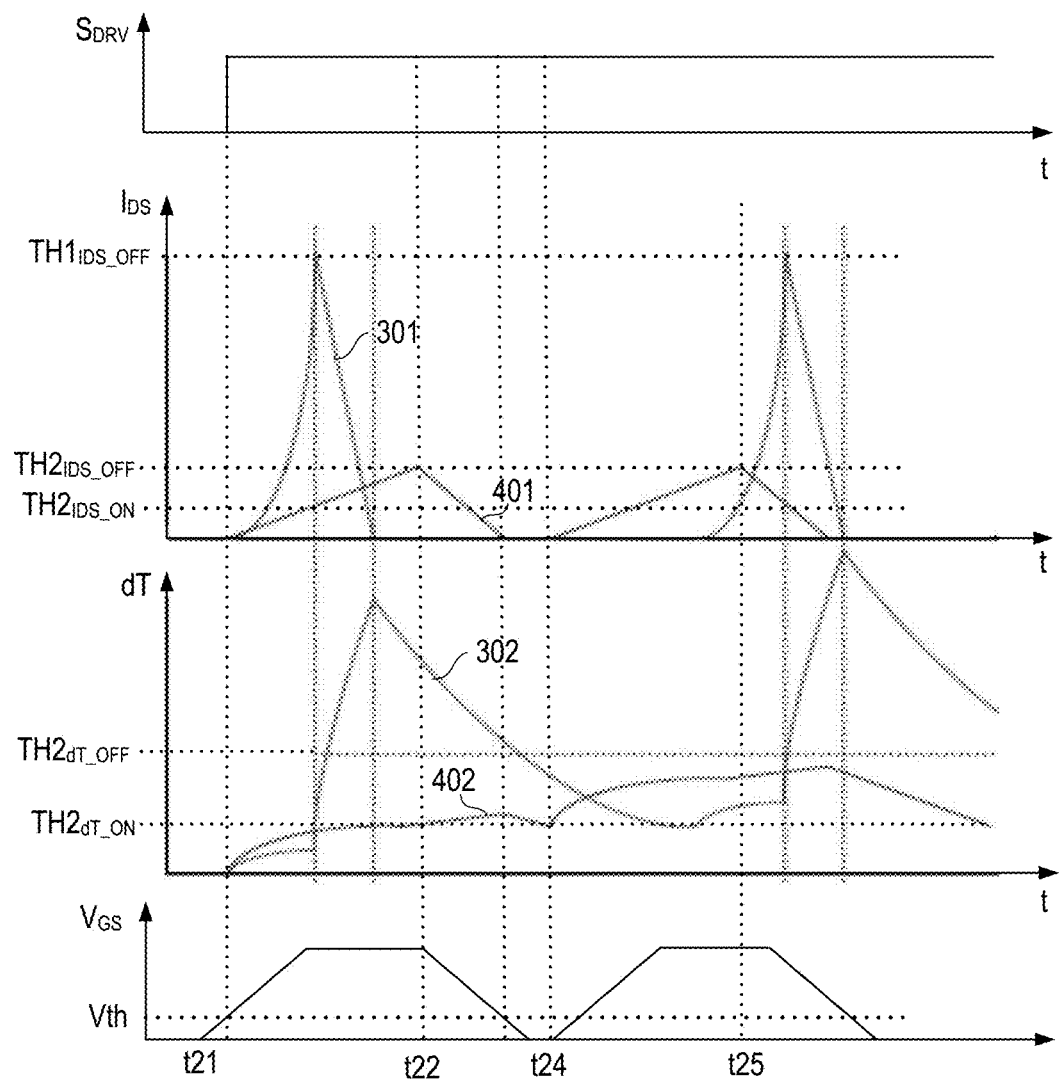

FIGS. 11A and 11B illustrate improvements that can be obtained by operating the transistor device in the second operating mode 120 instead of the first operating mode no when a high load current $I_{DS}$, such as an inrush current of a capacitive component, occurs. FIG. 11A illustrates operating the transistor device in the first operating mode no and FIG. 11B illustrates operating the transistor device in the second operating mode, wherein each of these figures shows signal waveforms of the load current $I_{DS}$, a temperature difference dT between temperatures at a first position and a second position, such as first and second positions 234, 235 illustrated in FIG. 10, and the drive voltage $V_{GS}$. The drive voltage is only schematically illustrated in FIGS. 11A and 11B so that the Miller plateau, for example, is not illustrated.

In each of these examples, operating the transistor device 1 includes operating the transistor device 1 based on the drive signal $S_{DRV}$ and based on two operating parameters, the load current $I_{DS}$ and the temperature difference dT. Further, in each of these examples, after a fault has been detected and the transistor device 1 has been switched off, the transistor device 1 again switches on as soon as the fault condition disappears, that is, when the fault condition no longer prevails.

In the example illustrated in FIG. 11A, a signal level of the drive signal $S_{DRV}$ changes from the off-level to the on-level at a first time instance t11. At this time instance, the transistor device 1 starts to change from the off-state to the on-state. As the transistor device 1 switches on the load current $I_{DS}$ rapidly increases until it reaches a first load current threshold $TH_{IDS\_OFF}$ at a second time instance t12. At this time instance, the transistor device 1 starts to change from the on-state to the off-state, that is, the drive voltage $V_{GS}$ starts to decrease. Referring to FIG. 11A, the temperature difference dT starts to increase when the transistor device 1 switches on and further increases after the transistor device 1 has been switched off. This further increase of the temperature difference dT is due to the fact that a high amount of energy may be dissipated in the transistor device 1 when the transistor device 1 changes from the on-state to the off-state, wherein this dissipated energy causes an increase of the temperature difference after the transistor device 1 has been switched off. In the example shown in FIG. 11, the temperature difference dT reaches a first temperature difference threshold $TH1_{dT\_OFF}$ at a third time instance t13. However, as the transistor device 1 has already been switched off before reaching the first temperature difference threshold $TH1_{dT\_OFF}$ by the temperature difference does not have an effect on the switching state of the transistor device 1.

In the example illustrated in FIG. 11A, a hysteresis is implemented in both operating the transistor device 1 based on the load current $I_{DS}$ and operating the transistor device 1 based on the temperature difference dT. This means that the transistor device 1 switches off when one of the load current $I_{DS}$ and the temperature difference dT reaches the respective first threshold $TH_{IDS\_OFF}$, $TH1_{dT\_OFF}$, which is referred to as off-threshold in the following, and again switches on when both of the load current $I_{DS}$ and the temperature difference dT have fallen below a respective on-threshold $TH1_{IDS\_OFF}$, $TH1_{dT\_ON}$. The on-threshold $TH1_{IDS\_ON}$, $TH1_{dT\_ON}$ is smaller than the respective off-threshold $TH1_{IDS\_OFF}$, $TH1_{dT\_OFF}$, that is, $TH1_{IDS\_ON}$<$TH1_{IDS\_OFF}$ and $TH1_{dT\_ON}$<$TH1_{dT\_OFF}$. In the example shown in FIG. 11A, the temperature difference decreases slower than the load current $I_{DS}$ so that the load current $I_{DS}$ falls below the on-threshold $TH1_{ON\_IDS}$ before the temperature difference dT falls below the respective on-threshold $TH1_{dT\_ON}$. The latter occurs at a fourth time instance t14, so that at this time instance t14, the transistor device 1 again starts to switch on so that the load current $I_{DS}$ again rapidly increases and reaches the off-threshold $TH1_{OFF\_IDS}$ at a fifth time instance t15 at which the transistor device 1 again switches off.

The timing diagram shown in FIG. 11A illustrates operating a transistor device connected in series with the capacitive load, wherein a capacitive component of the load is completely discharged at the first time instance t11. A certain amount of charge is transferred to the capacitive component each time the transistor device 1 switches on wherein this amount of charge is essentially given by the integral of the load current I during the on-time of the transistor device 1. The "on-time" is the time period in which the transistor device 1 is switched on. In FIG. 11A, two switching cycles of the transistor device 1 are shown. In each of these switching cycles, the transistor device 1 switches on until a fault is detected, wherein the transistor device remains in the off-state until the fault condition has disappeared. The latter is equivalent to the fact that both of the monitored operating parameters (the load current I and the temperature difference dT in this example) have fallen below the respective on-threshold TH1, TH1. Several of these switching cycles may occur until the capacitive component has been charged such that the load current $I_{DS}$ and/or the temperature difference dT do not reach the respective off-threshold $TH1_{IDS\_OFF}$, $TH1_{dT\_OFF}$ anymore, and the transistor device 1 remains in the on-state. However, in each of these cycles, a load condition of the transistor device 1 can be such that the transistor device 1 is operated at the border of its SOA or beyond.

FIG. 11B illustrates operating the transistor device 1 at the same load conditions explained with reference to FIG. 11A, but in the second operating mode 120. In this operating mode, also several switching cycles may occur, wherein in each of these switching cycles, the capacitive component of a capacitive load is charged. In this second operating mode, however, the transistor device 1 already switches off when the load current $I_{DS}$ reaches a second off-threshold $TH2_{IDS\_OFF}$ or when the temperature difference dT reaches a second off-threshold $TH2_{dT\_OFF}$.

When the transistor device 1 is operated based on only one operating parameter the off-threshold in the second operating mode is lower in the second operating mode than in the first operating mode. When, as illustrated in FIGS. 11A and 11B, the transistor device 1 is operated based on two or more operating parameters the off-threshold associated with at least one of these operating parameters is lower in the second operating mode than in the first operating mode. That is, in the example illustrated in FIGS. 11A and 11B, the second off-threshold $TH2_{IDS\_OFF}$ of the load current $I_{DS}$ is lower than the first off-threshold $TH_{IDS\_OFF}$ and/or the second off-threshold $TH2_{dT\_OFF}$ of the temperature difference is lower than the first off-threshold $TH1_{dT\_OFF}$. The respective on-thresholds $TH2_{IDS\_ON}$, $TH2_{dT\_ON}$ can be the same as in the first operating mode 110, so that $TH2_{IDS\_ON}$=$TH1_{IDS\_ON}$ and $TH2_{dT\_ON}$=$TH1_{dT\_ON}$.

In FIG. 11B, curve 401 illustrates the load current $I_{DS}$ and curve 402 illustrates the temperature difference dT in the second operating mode. Curves 301, 302, for comparison reasons, illustrate the load current $I_{DS}$ and the temperature difference dT in the first operating mode under the same load conditions. Referring to FIG. 11B, in the second operating mode, the drive signal $S_{DRV}$ changes from the off-level to the on-level at a first time instance t21. At this first time instance t21, the transistor device 1 starts to switch on, so that the load current $I_{DS}$ increases and the temperature difference dT increases. However, as the slew rate in the second operating mode 120 is smaller than in the first operating mode no, the load current $I_{DS}$ increases slower than in the first operating mode no. The temperature difference dT, however, increases faster as more power is dissipated in the transistor device 1 at the beginning of the on-state. At a second time instance t22, the load current $I_{DS}$ reaches the second off-threshold $TH2_{IDS\_OFF}$ so that the transistor device 1 starts to switch off. Referring to FIG. 11B, the transistor device 1 again starts to switch on at a third time instance t24 at which both the load current $I_{DS}$ and the temperature difference dT have fallen below their respective on-threshold $TH2_{IDS\_ON}$, $TH2_{dT\_ON}$.

Referring to the above, several switching cycles may also occur in the second operating mode 120. However, as the off-thresholds $TH2_{IDS\_OFF}$, $TH2_{dT\_OFF}$ are lower in the second operating mode than in the first operating mode, the transistor device 1 is not operated at the boarder of its SOA, so that it may sustain a plurality of the switching cycles illustrated in FIG. 11B without being degraded.

Figure 12:
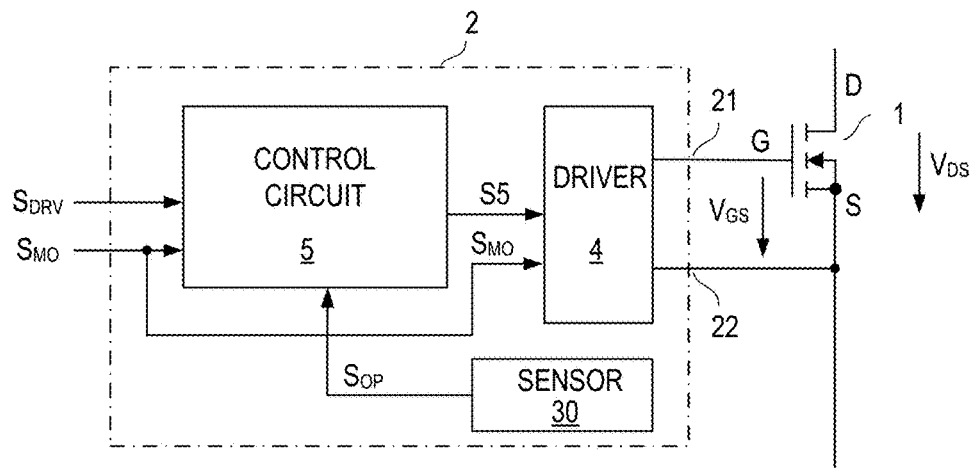
FIG. 12 shows one example of a drive circuit that includes a control circuit and a driver.

FIG. 12 shows one example of the drive circuit 2 in greater detail. In this example, the drive circuit 2 includes a control circuit 5 that receives the drive signal $S_{DRV}$ and the operating mode signal $S_{MO}$. Further, the control circuit 5 receives the operating parameter signal $S_{OP}$ from a sensor 30. This sensor 30 may be implemented in accordance with any one of the examples illustrated in FIGS. 7 to 9. The control circuit 5 is configured to process the drive signal $S_{DRV}$, the operating mode signal $S_{MO}$, and the operating parameter signal $S_{OP}$ and output a control signal S5 to a driver 4. The driver 4 is configured to generate the drive voltage $V_{GS}$ based on the control signal S5. The driver 4 further receives the operating mode signal $S_{MO}$. The control signal S5 includes the information on the desired switching state (on-state or off-state) of the transistor device 1. Referring to the above, the desired switching state is dependent on the drive signal $S_{DRV}$ and the operating mode signal $S_{MO}$. The control circuit 5 receives the operating mode signal $S_{MO}$ in order to be able to suitable select the threshold that is to be compared with the operating parameters, and the driver receives the operating mode signal $S_{MO}$ in order to be able to suitable adjust the slew rate of the drive voltage $V_{GS}$.

Figure 13:
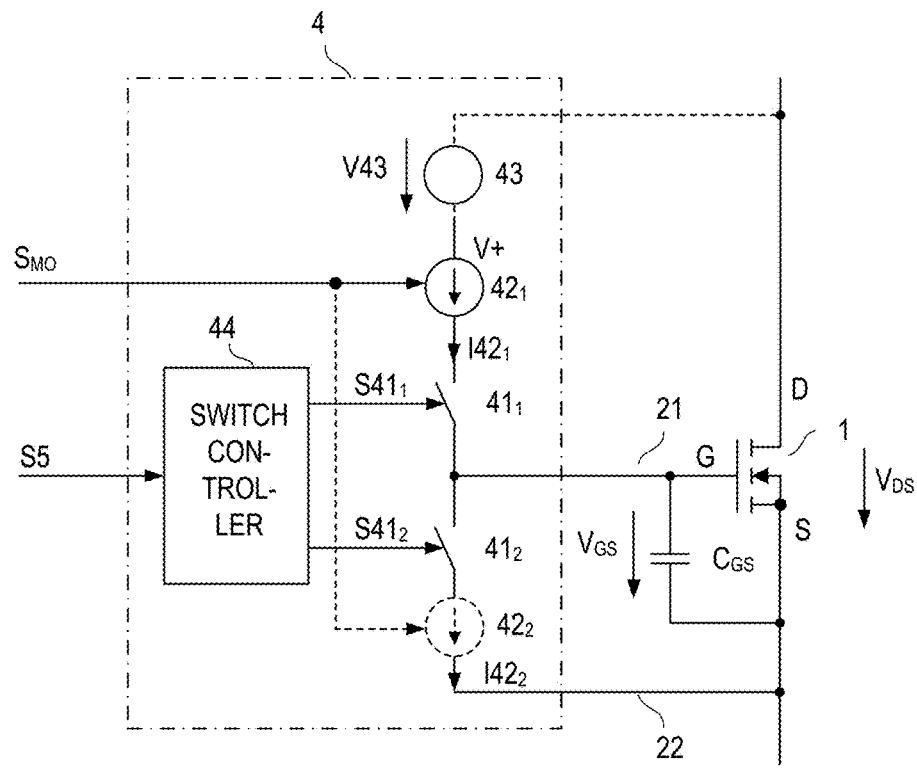
FIG. 13 shows one example of the driver in greater detail.

FIG. 13 shows one example of the driver 4. In this example, the driver 4 includes a first electronic switch $41_1$ and first current source $42_1$, wherein a series circuit with the first electronic switch $41_1$ and the first current source $42_1$ is connected between the first output node 21 and an internal supply node where a supply potential V+ for driving the transistor device 1 in the on-state is available. According to one example, the supply potential V+ is provided by a voltage source 43 coupled between the supply node and the second load node (drain node) D of the transistor device 1. This voltage source 43 can be any type of voltage source that is suitable for generating a supply potential V+ that is greater than an electrical potential at the first output node 21. According to one example, this voltage source 43 includes a bootstrap circuit or the like.

Referring to FIG. 13, the driver 4 further includes a second electronic switch $41_2$ connected between the first output node 21 and the second output node 22. Optionally, a second current source $42_2$ is connected in series with the second electric switch $41_2$. A switch controller 44 receives the control signal $S_5$ and switches the first electronic switch $41_1$ and the second electronic switch $41_2$ dependent on the control signal S5 in a complementary fashion. "Complementary" means that the switch controller 44 switches on only one of the first and second electronic switches $41_1$, $41_2$ at the same time.

Figure 14:
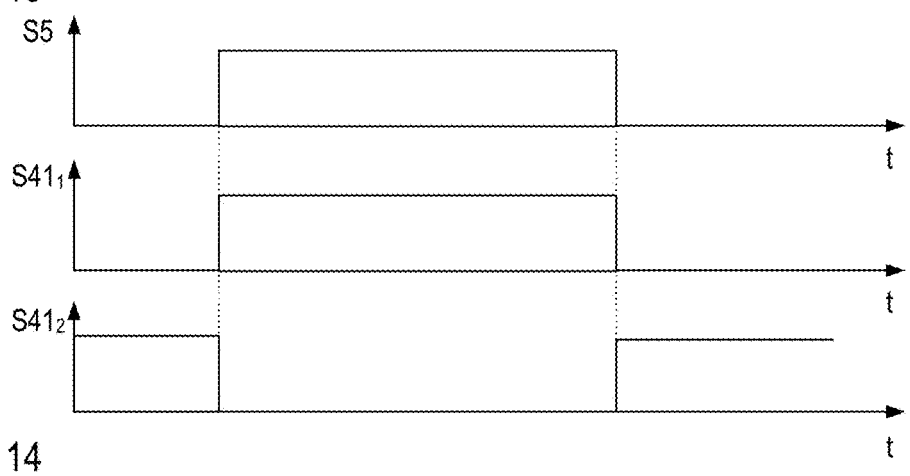
FIG. 14 show signal diagrams that illustrate the function of the driver shown in FIG. 13.

The function of the driver 4 shown in FIG. 13 is illustrated in FIG. 14, which shows example waveforms of the control signal S5, a first drive signal $S41_1$ generated by the switch controller 44 and received by the first electronic switch $41_1$, and a second drive signal $S41_2$ generated by the switch controller 44 and received by the second electronic switch $41_2$. According to one example, the control signal S5 has one of two different signal levels, a first signal level indicating that it is desired to switch on the transistor device 1, or a second signal level indicating that it is desired to switch off the transistor device 1. The first signal level of the control signal S5 is also referred to as on-level and the second signal level is also referred to as off-level in the following. Just for the purpose of illustration, the on-level is a high signal level in the example shown in FIG. 14, and the off-level is a low signal level. Equivalently, each of the first and second drive signals $S41_1$, $S41_2$ has one of a first signal level that switches on the respective electronic switch $41_1$, $41_2$, or a second signal level that switches off the respective electronic switch $41_1$, $41_2$. Just for the purpose of illustration, signal levels of the first and second drive signal $S41_1$, $S41_2$ that switch on the respective electronic switch are drawn as high signal levels in the example shown in FIG. 14. It should be noted that FIG. 14 schematically illustrates the function of the driver 4 so that, for example, time delays (propagation delays) between rising and falling edges of the control signal S5 and corresponding edges of the first and second drive signal $S41_1$, $S41_2$ are not illustrated in FIG. 14.

Referring to FIG. 14, the switch controller 44 switches on the first electronic switch $41_1$ and switches off the second electronic switch $41_2$ when the control signal S5 has an on-level. In this operating state of the driver 4, the first current source $42_1$ provides a drive current at the first output node 21 of the drive circuit 2. This drive current charges a gate-source capacitance $C_{GS}$ of the transistor device 1. This gate-source capacitance is an integral part of the transistor device 1 and is coupled between the control node G and the first load node S. For the purpose of illustration, this gate-source capacitance $C_{GS}$ is represented by a capacitor connected between the control node G and the first load node S in the example shown in FIG. 13. The operating state (on-state or off-state) of the transistor device 1 is dependent on a charging state of the gate-source capacitance $C_{GS}$, wherein the transistor device 1 is in the on-state when a charging state of the gate-source capacitance $C_{GS}$ is such that a voltage across the gate-source capacitance $C_{GS}$, which is equivalent to the drive voltage $V_{GS}$, is higher than the threshold voltage Vth of the transistor device 1. The slew rate of the drive voltage $V_{GS}$ when the transistor device 1 switches from the off-state to the on-state is dependent on a current level of a current $I42_1$ provided by the first current source $42_1$. Referring to FIG. 13, the first current source $42_1$ is an adjustable current source that receives the operating mode signal $S_{MO}$ and is configured to adjust the current level of the current $I42_1$ dependent on the operating mode signal $S_{MO}$. More specifically, the first current source $42_1$ is configured to adjust the current $I42_1$ such that it has a first current level when the operating mode signal $S_{MO}$ has the first level indicating that the transistor device 1 is to be operated in the first operating mode no, and such that the current $I42_1$ has a second current level lower than the first current level when the operating mode signal $S_{MO}$ has the second level indicating that it is desired to operate the transistor device 1 in the second operating mode 120. By this, a slew rate of the drive voltage $V_{GS}$ is lower in the second operating mode 120 than the first operating mode 110.

Referring to FIG. 14, the switch controller 44 switches off the first electronic switch $41_1$ and switches on the second electronic switch $41_2$ when the control signal S5 has the off-level. In this operating state, the gate-source capacitance $C_{GS}$ is discharged via the second electronic switch $41_2$ so that the transistor device 1 switches off. How fast the gate-source capacitance $C_{GS}$ is discharged can be controlled by the second current source $42_2$. According to one example, a current $I42_2$ provided by the second current source $42_2$ is independent of the operating mode signal $S_{MO}$. In this case, a slew rate when switching off the transistor device 1 is essentially the same in the first operating mode no and the second operating mode 120. According to another example, the second current source $42_2$ is an adjustable current source and receives the operating mode signal $S_{MO}$. In this case, the current $I42_2$ can be different in the first operating mode no and the second operating mode 120, so that different slew rates can be obtained. According to one example, the current $I42_2$ is smaller in the second operating mode 120 than in the first operating mode 110 so that the slew rate when switching off the transistor device 1 is smaller in the second operating mode 120 than the first operating mode 110.

According to one example, the driver 4 further includes a pre-charging current source (not shown) that is configured to rapidly pre-charge the gate-source capacitance $C_{GS}$ until the drive voltage $V_{GS}$ reaches the threshold voltage. After the gate-source capacitance $C_{GS}$ has been pre-charged by this pre-charging current source further charging of the gate source capacitance $C_{GS}$ is governed by the first current source $42_1$ in order to control the slew rate SR of the drive voltage $V_{GS}$. In each case, a maximum level of the $V_{GS\_MAX}$ of the drive voltage $V_{GS}$ is defined by the supply voltage V+. Alternatively to providing an additional pre-charging current source, the first current source $42_1$ can be controlled such that it rapidly charges the gate-source capacitance $C_{GS}$ independent of the operating mode until the drive voltage $V_{GS}$ reaches the threshold voltage Vth and, after the drive voltage $V_{GS}$ has reached the threshold voltage Vth, further charges the gate-source capacitance $C_{GS}$ dependent on the operating mode as explained above. A current level of the pre-charging current is higher than each of the first and second current levels.

Figure 15:
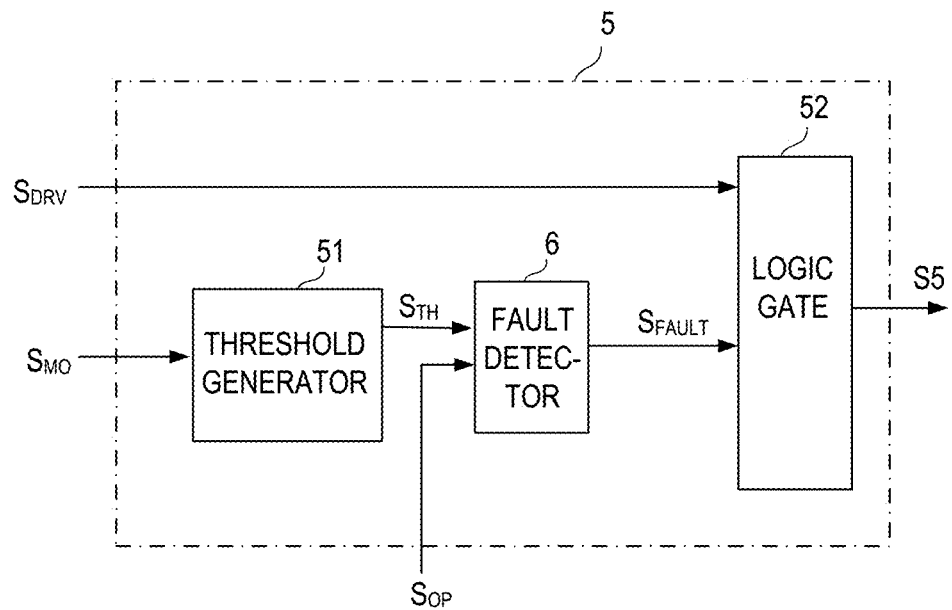
FIG. 15 shows one example of the control circuit in greater detail.

FIG. 15 shows one example of the control circuit 5 in greater detail. FIG. 15 shows a block diagram of the control circuit 5. It should be noted that this block diagram illustrates the functional blocks of the control circuit 5 rather than a specific implementation. Those functional blocks can be implemented in various ways. According to one example, these functional blocks are implemented using dedicated circuitry. According to another example, the control circuit 5 is implemented using hardware and software. The control circuit 5, for example, may include a microcontroller and software running on the microcontroller.

Referring to FIG. 15, the control circuit 5 includes a threshold generator 51 that outputs a threshold signal $S_{TH}$. This threshold signal $S_{TH}$ represents the threshold TH explained herein before. More specifically, this threshold signal $S_{TH}$ represents one of the off-thresholds ($TH_{IDS\_OFF}$, $TH1_{dT\_OFF}$, $TH2_{IDS\_OFF}$, $TH2_{dT\_OFF}$) explained herein before. The threshold generator 51 receives the operating mode signal $S_{MO}$ and is configured to generate the threshold signal $S_{TH}$ based on the operating mode signal $S_{MO}$. According to one example, the threshold generator 51 includes a look-up table in which values of the threshold signal $S_{TH}$ associated with the first operating mode and the second operating mode are stored, wherein the look-up table outputs the threshold signal associated with the first operating mode 110 when the operating mode signal $S_{MO}$ has the first level and wherein the look-up table outputs the threshold signal associated with the second operating mode 120 when the operating mode signal $S_{MO}$ has the second level.

Referring to FIG. 15, a fault detector 6 receives the threshold signal $S_{TH}$ and the operating mode signal $S_{MO}$ and outputs a fault signal $S_{FAULT}$ based on these signals $S_{TH}$, $S_{OP}$. According to one example, the fault detection signal $S_{FAULT}$ either has a fault level or a normal level. The fault level indicates that by comparing the threshold signal $S_{TH}$ with the operating parameter signal $S_{OP}$ a fault has been detected and that a fault condition prevails. The normal level indicates that no fault has been detected or that a fault condition does no longer prevail. A logic gate 52 receives the drive signal $S_{DRV}$ and the fault signal $S_{FAULT}$ and generates the control signal S5. The logic gate 52 generates the control signal S5 such that the control signal S5 has the on-level when the drive signal $S_{DRV}$ has the on-level and the fault signal $S_{FAULT}$ has a normal level, and such that the control signal $S_5$ has the off-level when the drive signal $S_{DRV}$ has the off-level and/or the fault signal $S_{FAULT}$ has the fault level. According to one example, the logic gate is an AND gate.

Figure 16:
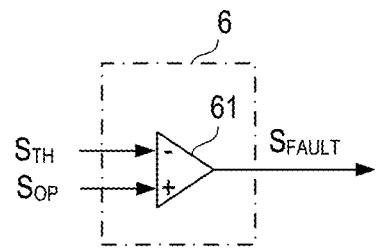
FIG. 16 shows one example of a fault detector implemented in the control circuit shown in FIG. 15.

FIG. 16 shows one example of the fault detector 6. In this example, the fault detector 6 includes a comparator 61 that receives the threshold signal $S_{TH}$ and the operating parameter signal $S_{OP}$ and outputs the fault signal $S_{FAULT}$ based on comparing the operating parameter signal and the threshold signal $S_{TH}$.

Figure 17:
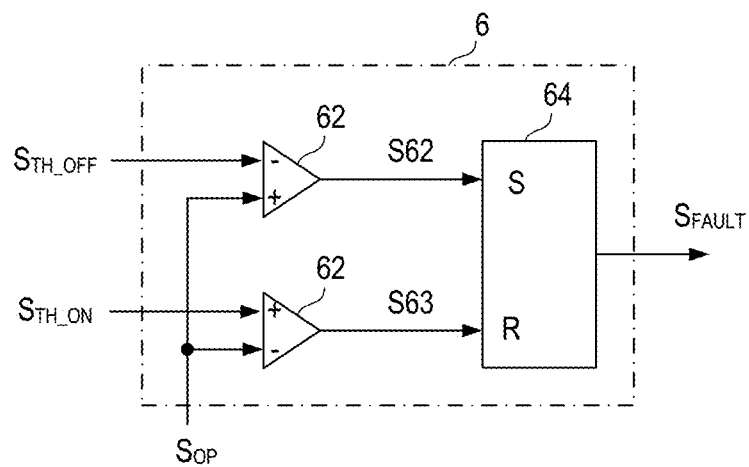
FIG. 17 shows another example of a fault detector implemented in the control circuit shown in FIG. 15.

FIG. 17 illustrates a fault detector 6 according to another example. In this example, the threshold signal $S_{TH}$ includes a first signal $S_{TH\_OFF}$ representing an off-threshold and a second signal $S_{TH\_ON}$ representing an on-threshold. So that the fault detector 6 is configured to provide for a hysteresis in switching on and off the transistor device 1. Referring to FIG. 17, a first comparator 62 receives the first threshold signal $S_{TH\_OFF}$ and the operating parameter signal $S_{OP}$ and outputs a first comparator signal S62. A second comparator 63 receives the second threshold signal $S_{TH\_ON}$ and the second operating parameter signal $S_{OP}$ and outputs a second comparator signal $S6_3$. The first threshold signal $S_{TH\_OFF}$, for example, represents one of the first off-thresholds $TH1_{IDS\_OFF}$, $TH1_{dT\_OFF}$ (in the first operating mode 110) and the second thresholds $TH2_{IDS\_OFF}$, $THH2_{dT\_OFF}$ (in the second operating mode 120), and the second threshold signal $S_{TH\_ON}$ represents one of the first on-thresholds $TH1_{IDS\_ON}$, $TH1_{dT\_ON}$ (in the first operating mode 110) and the second on-thresholds $TH2_{IDS\_ON}$, $TH2_{dT\_ON}$ (in the second operating mode 120).

Referring to FIG. 17, a latch such as an SR-flip-flop receives the first comparator signal S62 and the second comparator signal S63 and outputs the fault signal $S_{FAULT}$. According to one example, the comparators 62, 63 and the latch 64 are adapted to one another such that the latch 64 outputs a fault level of the fault signal $S_{FAULT}$ when the operating parameter signal $S_{OP}$ rises above the off-threshold signal $S_{TH\_OFF}$ and outputs the normal level of the fault signal $S_{FAULT}$ when the operating parameter signal $S_{OP}$ falls below the on-threshold signal $S_{TH\_ON}$. According to one example this can be obtained by receiving the first comparator signal S62 at a set input and the second comparator signal S63 at a reset input of the latch 64, by receiving the off-threshold signal $S_{TH\_OFF}$ at an inverting input of the first comparator 62, the operating parameter signal $S_{OP}$ at a non-inverting input of the first comparator 62, and by receiving the on-threshold signal $S_{TH\_ON}$ at a non-inverting input of the second comparator 63 and the operating parameter signal $S_{OP}$ at an inverting input of the second comparator 63.

Figure 18:
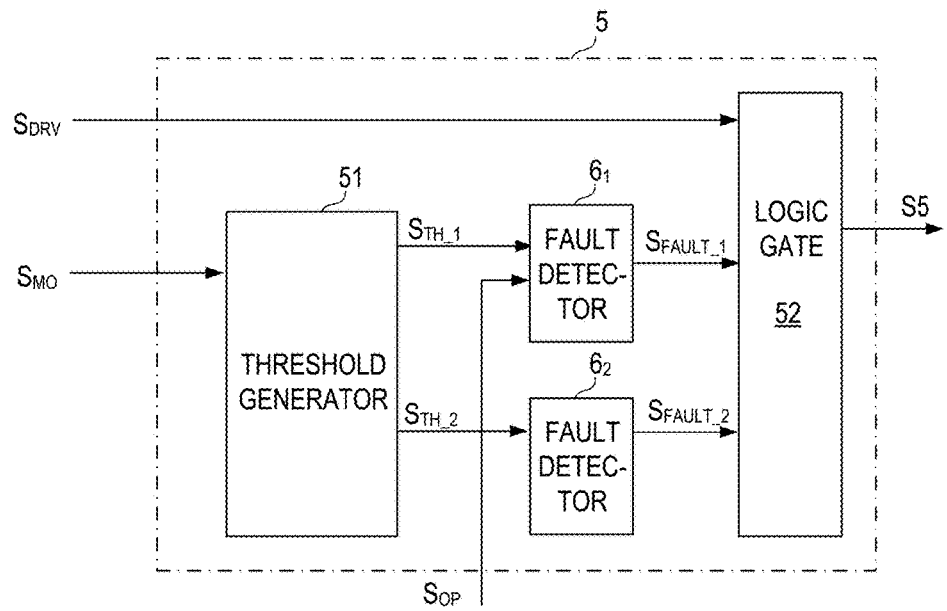
FIG. 18 shows another example of the control circuit.

In the example illustrated in FIG. 15, the threshold generator 51 outputs one threshold signal $S_{TH}$. This, however, is only an example. According to another example illustrated in FIG. 18, the threshold generator 51 output to threshold signals $S_{TH\_1}$, $S_{TH\_2}$. Each of these threshold signals $S_{TH\_1}$, $S_{TH\_2}$ may include two sub signals, wherein one of these sub signals represents an off-threshold and the other one of these sub signals represents an on-threshold. According to one example, the first threshold signal $S_{TH\_1}$ represents the off-thresholds ($TH1_{IDS\_OFF}$, $TH2_{IDS\_OFF}$) and the on-thresholds ($TH_{IDS\_ON}$, $TH2_{IDS\_ON}$) associated with the load current $I_{DS}$ explained with reference to FIGS. 11A and 11B, and the second threshold signal $S_{TH\_2}$ represents the off-thresholds ($TH1_{dT\_OFF}$, $TH2_{dT\_OFF}$) and the on-thresholds ($TH1_{dT\_ON}$, $TH2_{dT\_ON}$) associated with the temperature difference dT explained with reference to FIGS. 11A and 11B. Referring to FIG. 18, the control circuit 5 further includes two fault detectors, a first fault detector 61 receiving the first threshold signal $S_{TH\_1}$ and a first operating parameter signal $S_{OP\_1}$, and a second fault detector 62 receiving the second threshold signal $S_{TH\_2}$ and a second operating parameter signal $S_{OP\_2}$. The first operating parameter signal $S_{OP\_1}$ represents a first operating parameter such as the load current $I_{DS}$, and the second operating parameter signal $S_{OP\_2}$ represents a second operating parameter such as the temperature difference dT.

Each of the first and second fault detectors 61, 62 shown in FIG. 18 can be implemented in accordance with one of the examples illustrated in FIGS. 16 and 17. Further, each of these fault detectors 61, 62 outputs a fault signal $S_{FAULT\_1}$, $S_{FAULT\_2}$. The logic gate 53 receives the drive signal $S_{DRV}$ and the fault signals $S_{FAULT\_1}$, $S_{FAULT\_2}$ and generates the control signal $S_5$ such that the control signal $S_5$ has an on-level only when the drive signal $S_{DRV}$ has the on-level and none of the first and second fault signal $S_{FAULT\_1}$, $S_{FAULT\_2}$ has a fault level.

Referring to the above, the load current $I_{DS}$ and the temperature difference dT are examples of operating parameters based on which the transistor device 1 can be operated. This, however, is only an example. Other operating parameters may be used as well. Another operating parameter that may be used is the absolute temperature of the transistor device 1. The absolute temperature may be obtained, for example, from a temperature sensor corresponding to the temperature sensor 34 shown in FIG. 9. According to one example, the temperature sensor 30 shown in FIG. 9 output two operating parameter signals, a first operating parameter signal representing the temperature difference, and a second operating parameter signal being equal to the output signal $S_{T1}$ of temperature sensor 34 and representing the absolute temperature.

Figure 19:
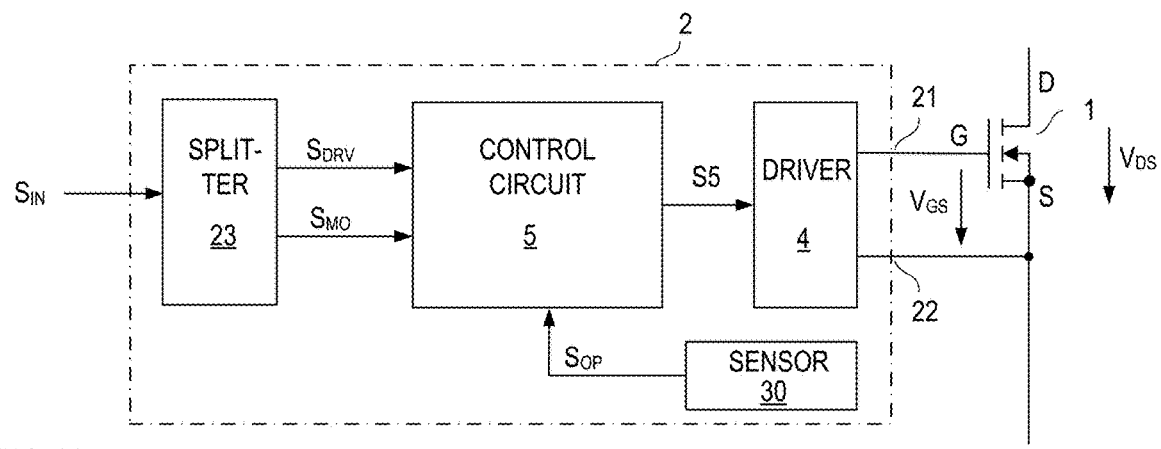
FIG. 19 shows a modification of the drive circuit shown in FIG. 12.

The drive circuit 2 may receive the drive signal $S_{DRV}$ and the operating mode signal $S_{MO}$ as two separate signals. This, however, is only an example. According to another example, the drive circuit 2 receives an input signal $S_{IN}$ that includes information on both the drive signal $S_{DRV}$ and the operating mode signal $S_m$. In this example, the drive circuit 2 includes a splitter circuit 23 that receives the input signal $S_{IN}$ and is configured to generate the drive signal $S_{DRV}$ and the operating mode signal $S_{MO}$ based on the input signal $S_{IN}$. One example of a drive circuit 2 including a splitter circuit 23 is shown in FIG. 19.

Figure 20:
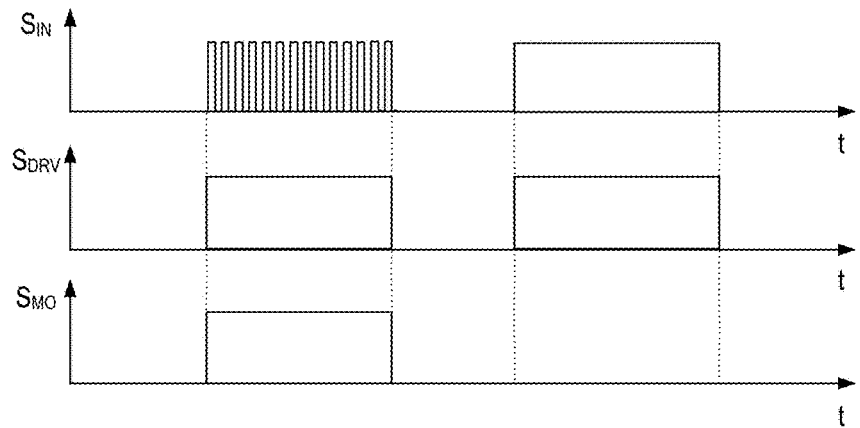
FIG. 20 shows timing diagrams that illustrate a function of a splitter circuit shown in FIG. 19.

One example of an input signal $S_{IN}$ that includes information on both the drive signal $S_{DRV}$ and the operating mode signal $S_{MO}$ is illustrated in FIG. 20. In this example, the input signal $S_{IN}$ is a signal obtained by frequency modulating the drive signal $S_{DRV}$ with one of a first frequency and a second frequency lower than the first frequency. According to one example, the first frequency is significantly higher than a maximum frequency at which drive pulses of the drive signal $S_{DRV}$ may occur. A "drive pulse" is a signal pulse of the drive signal with an on-level. According to one example the first frequency is greater than 10 kHz. The second frequency may be zero. In the example illustrated in FIG. 20, two drive pulses of the drive signal $S_{DRV}$ are shown. A first of these drive pulses is modulated with the first frequency, which represents the first signal level of the operating mode signal $S_{MO}$, and a second drive pulse is modulated with the second frequency (which is zero in the example shown in FIG. 20), which represents the second signal level of the operating mode signal $S_{MO}$.

Figure 21:
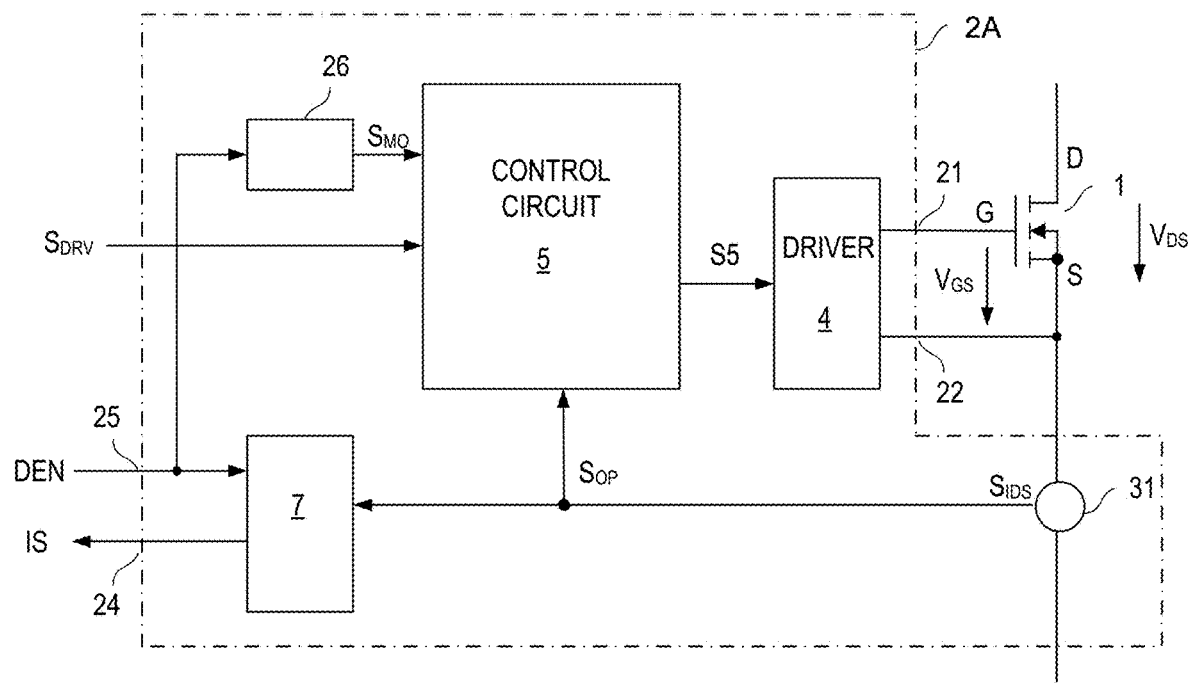
FIG. 21 shows another modification of the drive circuit.

FIG. 21 shows another example of the drive circuit 2. In this example, the drive circuit 2 includes a current measurement output 24 configured to output a signal IS representing a load current $I_{DS}$ through the transistor device 1 and an enable input 25 configured to receive an enable signal DEN. The enable signal DEN enables or disables the drive circuit 2 to output a current measurement signal $S_{IDS}$. This current measurement signal $S_{DS}$ may be the same signal that is received by the control circuit 5 as the only operating parameter signal $S_{OP}$ or as one of several operating parameter signals. A pass circuit 7 receives the current measurement signal $S_{IDS}$ and the enable signal DEN and outputs the current measurement signal $S_{IDS}$ at the current measurement output 24 only when the enable signal DEN has a predefined signal level that enables the pass circuit 7.

The enable signal DEN, as well as the drive signal $S_{DRV}$, may be generated by a control circuit (not shown in the drawings), such as, for example, a microcontroller. This microcontroller may control several electronic circuits of the type explained herein before. Via enable inputs of the type explained with reference to FIG. 21 the microcontroller may poll the current measurement signals from several electronic circuits subsequently.

According to one example the drive circuit 2 also receives an information on the operating mode signal $S_{MO}$ via this enable input 25. In this example, an operating mode detector 26 is coupled to the enable input 25 and is configured to obtain the operating mode signal $S_{MO}$ from the enable signal DEN.

Figure 22:
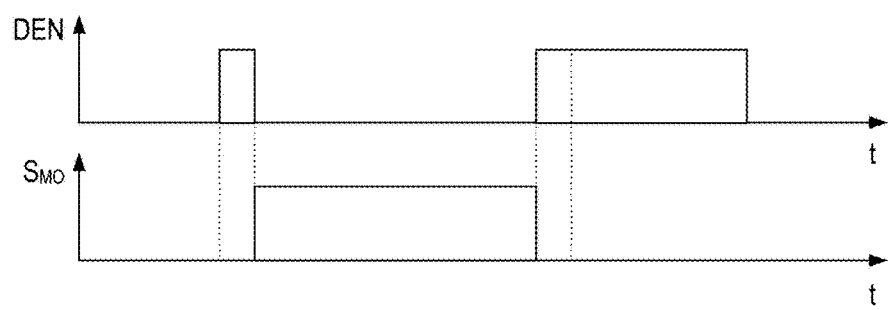
FIG. 22 shows timing diagrams that illustrate a function of the drive circuit shown in FIG. 21.

FIG. 22 shows example signal waveforms of the enable signal DEN and the operating mode signal $S_{MO}$ in order to illustrate one example of how the information on the operating mode signal $S_{MO}$ can be conveyed by the enable signal DEN. In this example, a signal pulse of a predefined duration activates the first operating mode, which is illustrated in FIG. 22 in that the operating mode signal $S_{MO}$ has the first level. "A signal pulse of the predefined duration" means that the enable signal DEN has the first signal level for the predefined duration. According to one example, the first signal level is the signal level that activates enables the pass circuit. The predefined duration, however, may be too short for the pass circuit 7 to output the signal IS representing the load current $I_{DS}$ or too short for the microcontroller (not shown) receiving the measurement signal IS to process the signal IS. The predefined duration, for example, is selected from between 10 microseconds (μs) and 50 microseconds.

Referring to FIG. 22, the second operating mode is activated when the enable signal DEN again changes to the first signal level after the signal pulse.

Figure 23:
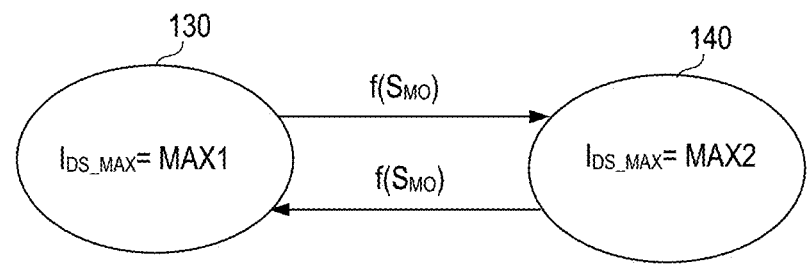
FIG. 23 shows a state diagram that illustrates another example of operating the transistor device in a first operating mode or a second operating mode based on an operating mode signal.

FIG. 23 illustrates another example of a method for operating the transistor device 1 in a first operating mode 130 and a second operating mode 140 dependent on the operating mode signal $S_{MO}$. In this example, operating the transistor device 1 includes limiting the load current $I_{DS}$ through the transistor device 1 to a maximum current level $I_{DS\_MAX}$, wherein this maximum current level is greater in the first operating mode 130 than the second operating mode 140, that is, MAX1>MAX2. According to one example, the current limit MAX2 in the second operating mode 140 is between 5% and 15% of the current limit MAX1 in the first operating mode 130. According to one example, the current limit MAX1 in the first operating mode is between 50 amperes (A) and 70 amperes and the current limit in the second operating mode 140 is between 3 amperes and 8 amperes.

Figure 24:
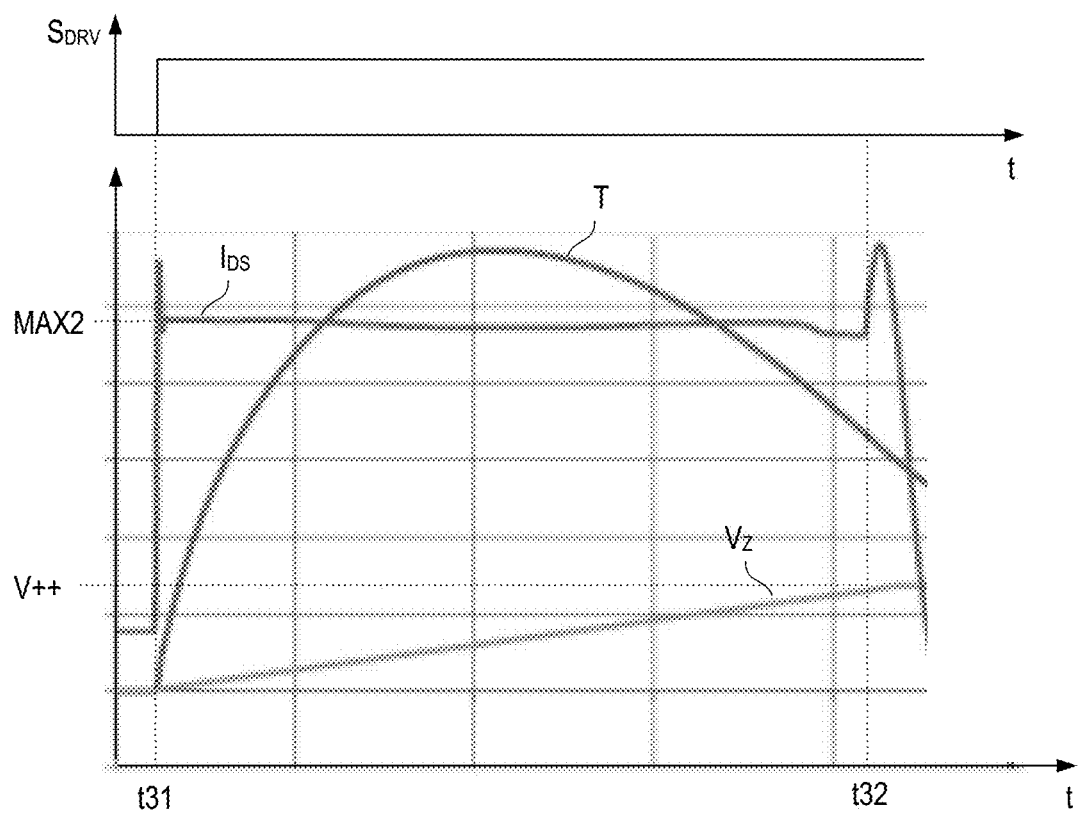
FIG. 24 show signal diagrams that illustrate operating the transistor device in the second operating mode.

FIG. 24 illustrates operating the transistor device in the second operating mode 140, that is, the operating mode in which the load current is limited to the lower maximum level MAX2. More specifically, FIG. 24 illustrates waveforms of the drive signal $S_{DRV}$, the load current $I_{DS}$, the temperature difference dT and a voltage $V_Z$ across a load connected in series with the transistor device 1. The signals shown in FIG. 24 illustrate operating the transistor device 1 in one of the applications shown in FIGS. 2A and 2B and under the assumption that the load $Z_0$ is a capacitive load that is discharged before a time instance t31.

Referring to FIG. 24, the drive signal $S_{DRV}$ switches on the transistor device 1 at the first time instance t31. After this time instance, the load current rapidly increases and is limited to the second maximum MAX2. The load current $I_{DS}$ charges the capacitive component of the load so that the load voltage $V_Z$ increases. At a second time instance t32, the capacitive component has been charged to such an extent (to the level of the supply voltage, for example, that the load current $I_{DS}$ decreases to below the limit MAX2. Limiting the load current $I_{DS}$ causes power losses in the transistor device 1 that cause the transistor device 1 to be heated and, therefore, the temperature to increase. The dissipated power decreases as the voltage $V_z$ across the load increases, so that the temperature T rapidly increases after the first time instance t31 and then decreases. Nevertheless, by virtue of limiting the load current to the relatively low second maximum MAX2 the absolute temperature and the temperature difference can be kept below critical levels.

Operating the transistor device 1 in the first operating mode is similar to operating the transistor device in the second operating mode with the difference that the load current $I_{DS}$ is limited to the higher maximum MAX1. When charging a capacitive load this may have the effect that the absolute temperature or the temperature difference reaches critical levels. The transistor device 1 may be switched off when the absolute temperature or the temperature difference reaches a critical level in order to protect the transistor device 1. Nevertheless, in this case, the transistor device 1 is operated at the border of its SOA. Thus, the charging process can be improved by operating the transistor device 1 in the second operating mode 140 instead of the first operating mode 130.

Figure 25:
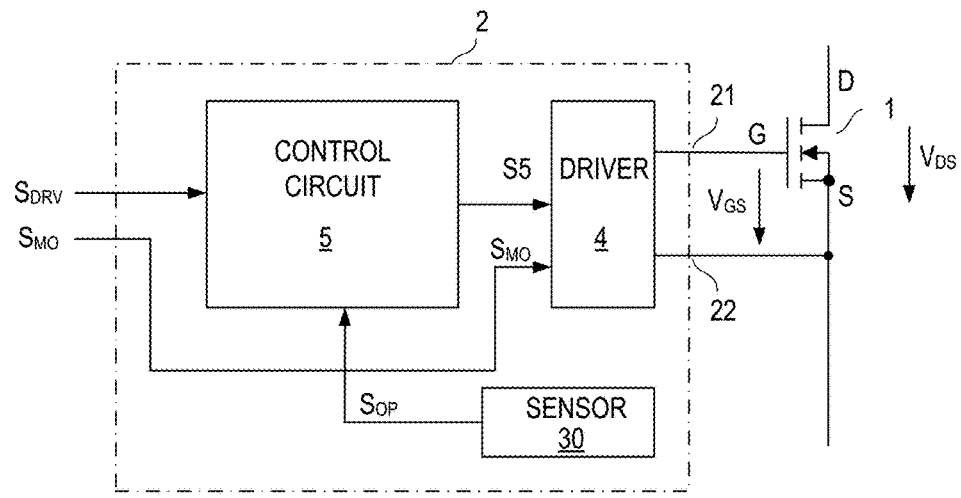
FIG. 25 shows one example of a drive circuit configured to operate the transistor device in one of the first operating mode and the second operating mode according to FIG. 23.

FIG. 25 shows one example of a drive circuit 2A configured to operate the transistor device 1 in one of the first operating mode 130 and the second operating mode according to FIG. 23. This drive circuit 25 is based on the drive circuit 2 explained herein before and is different from the drive circuit explained herein before that only the driver 4 receives the operating mode signal $S_{MO}$. The control circuit 5 may receive at least one operating parameter signal $S_{OP}$ and be configured to switch off the transistor device when the operating parameter represented by the at least one operating parameter signal $S_{OP}$ reaches a predefined threshold. The operating parameter is, for example, the temperature difference or the absolute temperature. The control circuit 5 may be implemented in accordance with FIG. 15, with the difference that the threshold generator 51 generates (provides) the at least one threshold signal independent of the operating mode.

Optionally, not only the driver 4 but also the control circuit 5 receives the operating mode signal $S_{MO}$. This is illustrated in dashed lines in FIG. 25. In this example, the control circuit 5 is configured to adapt the threshold dependent on the operating mode. According to one example, the control circuit 5 is configured to adapt the threshold such that it is lower in the second operating mode than in the first operating mode.

Figure 26:
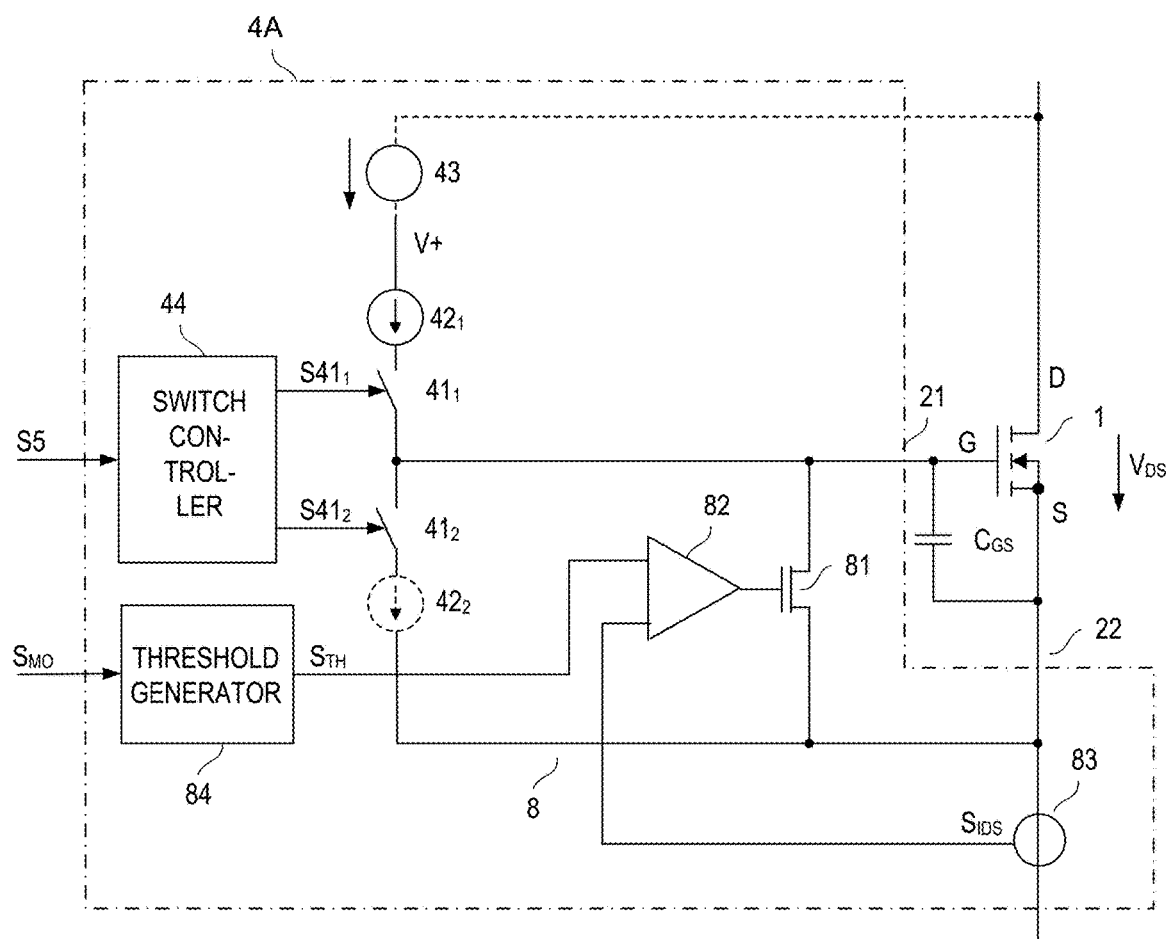
FIG. 26 shows one example of a driver shown in FIG. 25 in greater detail.

FIG. 26 shows one example of the driver 4A. This driver is based on the driver illustrated in FIG. 13 and is different from the driver 4 shown in FIG. 13 in that the first current source $42_1$ (and the optional second current source $42_2$) is a fixed current source. Further, the driver 4 includes a current limiting circuit 8 that receives the operating mode signal $S_{MO}$ and is configured to control the transistor device 1 such that the load current $I_{DS}$ is limited to a current level represented by a threshold signal $S_{TH}$. This threshold signal is provided by a threshold signal generator and represents the first maximum MAX1 in the first operating mode 130 and the second maximum MAX2 in the second operating mode 140.

What is claimed is:

1. A method comprising:
    operating a transistor device by a drive circuit in one of a first operating mode and a second operating mode based on an operating mode signal received by the drive circuit,
    wherein operating the transistor device in each of the first operating mode and the second operating mode comprises
        switching on the transistor device based on a drive signal received by the drive circuit,
        monitoring at least one operating parameter of the transistor device, and
        switching off the transistor device independent of the drive signal when the at least one operating parameter reaches a respective predefined off-threshold,
    wherein switching on the transistor device in the second operating mode comprises switching on the transistor device with a second slew rate that is smaller than a first slew rate in the first operating mode, and
    wherein the predefined off-threshold is lower in the second operating mode than in the first operating mode.

2. The method of claim 1,
    wherein the at least one operating parameter comprises a plurality of operating parameters, and
    wherein the respective predefined off-threshold of at least one of the plurality of operating parameters is lower in the second operating mode than in the first operating mode.

3. The method of claim 1, wherein the at least one operating parameter is selected from the group consisting of:
    a load current through the transistor device;

a temperature difference between temperatures at two different positions of an integrated circuit in which the transistor device is implemented; and an absolute temperature of the transistor device.

4. The method of claim 1, wherein a level of the predefined off-threshold in the second operating mode is between 50% and 80% of the level of the predefined off-threshold in the first operating mode.

5. The method of claim 1, further comprising:

after switching off the transistor device based on the predefined off-threshold, again switching on the transistor device when the drive signal has an on-level and the at least one operating parameter is below a respective predefined on-threshold.

6. The method of claim 5, wherein the respective predefined on-threshold is lower is essentially the same in the first operating mode and the second operating mode.

7. The method of claim 1, wherein the drive circuit receives the operating mode signal together with at least one other signal at one input port.

8. The method of claim 7, wherein the at least one other signal is the drive signal.

9. A method comprising:

operating a transistor device by a drive circuit in one of a first operating mode and a second operating mode based on an operating mode signal received by the drive circuit, wherein operating the transistor device in each of the first operating mode and the second operating mode comprises switching on the transistor device based on a drive signal received by the drive circuit, limiting a load current through the transistor device to a maximum current level, monitoring at least one operating parameter of the transistor device, and switching off the transistor device independent of the drive signal when the at least one operating parameter reaches a respective predefined threshold, wherein the maximum current level is lower in the second operating mode than in the first operating mode.

10. The method of claim 9, wherein the respective predefined threshold is essentially the same in the first operating mode and the second operating mode.

11. The method of claim 10, wherein the respective predefined threshold is lower in the second operating mode than in the first operating mode.

12. The method of claim 9, wherein the at least one operating parameter is selected from the group consisting of:

a temperature difference between temperatures at two different positions of an integrated circuit in which the transistor device is implemented; and an absolute temperature of the transistor device.

13. An electronic circuit comprising:

a drive circuit, wherein the drive circuit is configured to operate a transistor device in one of a first operating mode and a second operating mode based on an operating mode signal received by the drive circuit, wherein the drive circuit is configured, in each of the first operating mode and the second operating mode to switch on the transistor device based on a drive signal received by the drive circuit, to monitor at least one operating parameter of the transistor device, and to switch off the transistor device independent of the drive signal when the at least one operating parameter reaches a respective predefined off-threshold, wherein the drive circuit is configured, in the second operating mode to switch on the transistor device with a second slew rate that is smaller than a first slew rate in the first operating mode, and wherein the predefined off-threshold is lower in the second operating mode than in the first operating mode.

14. The electronic circuit of claim 13, wherein the at least one operating parameter comprises a plurality of operating parameters, and wherein the respective predefined off-threshold of at least one of the plurality of operating parameters is lower in the second operating mode than in the first operating mode.

15. The electronic circuit of claim 14, wherein the at least one operating parameter is selected from the group consisting of:

a load current through the transistor device;

a temperature difference between temperatures at two different positions of an integrated circuit in which the transistor device is implemented; and an absolute temperature of the transistor device.

16. The electronic circuit of claim 13, further comprising the transistor device.

17. An electronic circuit comprising a drive circuit, wherein the drive circuit is configured to operate a transistor device in one of a first operating mode and a second operating mode based on an operating mode signal received by the drive circuit, wherein the drive circuit is configured, in each of the first operating mode and the second operating mode:

to switch on the transistor device based on a drive signal received by the drive circuit, to limit a load current through the transistor device to a maximum current level, to monitor at least one operating parameter of the transistor device, and to switch off the transistor device independent of the drive signal when the at least one operating parameter reaches a respective predefined threshold, wherein the maximum current level is lower in the second operating mode than in the first operating mode.

18. The electronic circuit of claim 17, further comprising the transistor device.

* * * * *